(12) United States Patent
Nandi et al.

(10) Patent No.: US 9,246,489 B1
(45) Date of Patent: Jan. 26, 2016

(54) INTEGRATED CLOCK GATING CELL USING A LOW AREA AND A LOW POWER LATCH

(71) Applicant: Texas Instruments Incorporated, Dallas, TX (US)

(72) Inventors: Suvam Nandi, Bangalore (IN); Badarish Mohan Subbannavar, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/499,745

(22) Filed: Sep. 29, 2014

(51) Int. Cl.
| | |
|---|---|
| *H03K 19/00* | (2006.01) |
| *H03K 19/0185* | (2006.01) |
| *H03K 19/096* | (2006.01) |
| *H03K 5/135* | (2006.01) |
| *H03K 3/037* | (2006.01) |

(52) U.S. Cl.
CPC .......... *H03K 19/0013* (2013.01); *H03K 3/0372* (2013.01); *H03K 5/135* (2013.01); *H03K 19/0002* (2013.01); *H03K 19/01855* (2013.01); *H03K 19/0966* (2013.01); *H03K 19/0016* (2013.01)

(58) Field of Classification Search
CPC ............ H03K 19/0013; H03K 3/0372; H03K 19/0002; H03K 19/01855; H03K 19/0963; H03K 19/0016; H03K 19/00361; H03K 5/135; H03K 3/012
USPC ........ 326/98, 93, 95; 327/208–212, 214, 224, 327/225
See application file for complete search history.

(56) References Cited

U.S. PATENT DOCUMENTS

| | | | | |
|---|---|---|---|---|
| 7,518,426 | B1 * | 4/2009 | Smith .................... | H03K 3/012 327/199 |
| 7,825,689 | B1 * | 11/2010 | Vasishta ............... | H03K 3/0375 326/119 |
| 8,816,741 | B2 * | 8/2014 | Liu ............................... | 327/212 |
| 2014/0184271 | A1 * | 7/2014 | Gurumurthy ...... | H03K 19/0016 326/93 |

* cited by examiner

*Primary Examiner* — Dylan White
(74) *Attorney, Agent, or Firm* — John R. Pessetto; Frank D. Cimino

(57) ABSTRACT

The disclosure provides an ICG (integrated clock gating) cell that utilizes a low area and a low power latch. The ICG cell includes a first logic gate that receives an enable signal and generates a latch input. A latch is coupled to the first logic gate and receives the latch input and a clock input. The latch includes a tri-state inverter and an inverting logic gate. The tri-state inverter is activated by a control signal generated by the inverting logic gate. A second logic gate receives the control signal and generates a gated clock.

18 Claims, 6 Drawing Sheets

US 9,246,489 B1

INTEGRATED CLOCK GATING CELL USING A LOW AREA AND A LOW POWER LATCH

TECHNICAL FIELD

Figure 1:
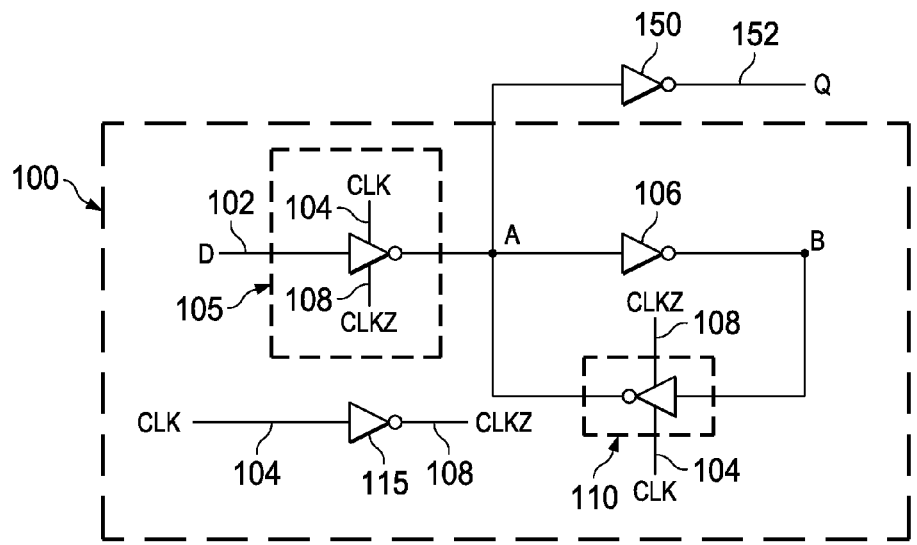

Embodiments of the disclosure relate to a low power latch based integrated clock gating (ICG) cells in an integrated circuit.

BACKGROUND

Sequential circuits occupy around 50% of a digital design. Integrated clock gating (ICG) technique is used to reduce power consumption by preventing individual flip flops from switching between logic states when not in use. Thus, the clock power consumption due to clock switching is reduced. In integrated clock gating, the flip flops which are not contributing to the functionality of the circuit are selectively deactivated. The ICG cells are activated or deactivated based on certain conditions. The conditions for disabling the clock cells are a design choice. In advanced digital designs, several clock gating cells are used which results in increased power consumption.

In power critical digital designs, more flip-flops are required to be clock gated which proportionately increases the number of ICG cells in the digital design. In an example, when sequential circuit occupy 50% of the digital design, and an ICG cell drives clock input to 4 flops, the ICG cell occupy around 5 to 7% of the digital design. A comparison of percentage of power consumption between the units of the IC are logic implementation consuming 29%, flip flops consuming 27%, RAM consuming 18%, clock tree consuming 16% and the ICG consuming 10% of the total power. It is apparent that a reduction in the power consumption and/or area of ICG cell will directly improve the overall power consumption of the digital design.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

An embodiment provides a latch. The latch includes a tri-state inverter that receives a latch input and a clock input. An inverting logic gate receives the clock input and an output of the tri-state inverter. The inverting logic gate generates a control signal. The control signal activates the tri-state inverter. A first inverter receives the output of the tri-state inverter and generates a first inverted output. A half tri-state inverter receives the control signal, the clock input and the first inverted output. An output inverter receives the output of the tri-state inverter and generates a latch output.

Another embodiment provides an ICG (integrated clock gating) cell. The ICG cell includes a first logic gate that receives an enable signal and generates a latch input. A latch is coupled to the first logic gate and receives the latch input and a clock input. The latch includes a tri-state inverter and an inverting logic gate. The tri-state inverter is activated by a control signal generated by the inverting logic gate. A second logic gate receives the control signal and generates a gated clock.

Other aspects and example embodiments are provided in the Drawings and the Detailed Description that follows.

BRIEF DESCRIPTION OF THE VIEWS OF DRAWINGS

Figure 2:
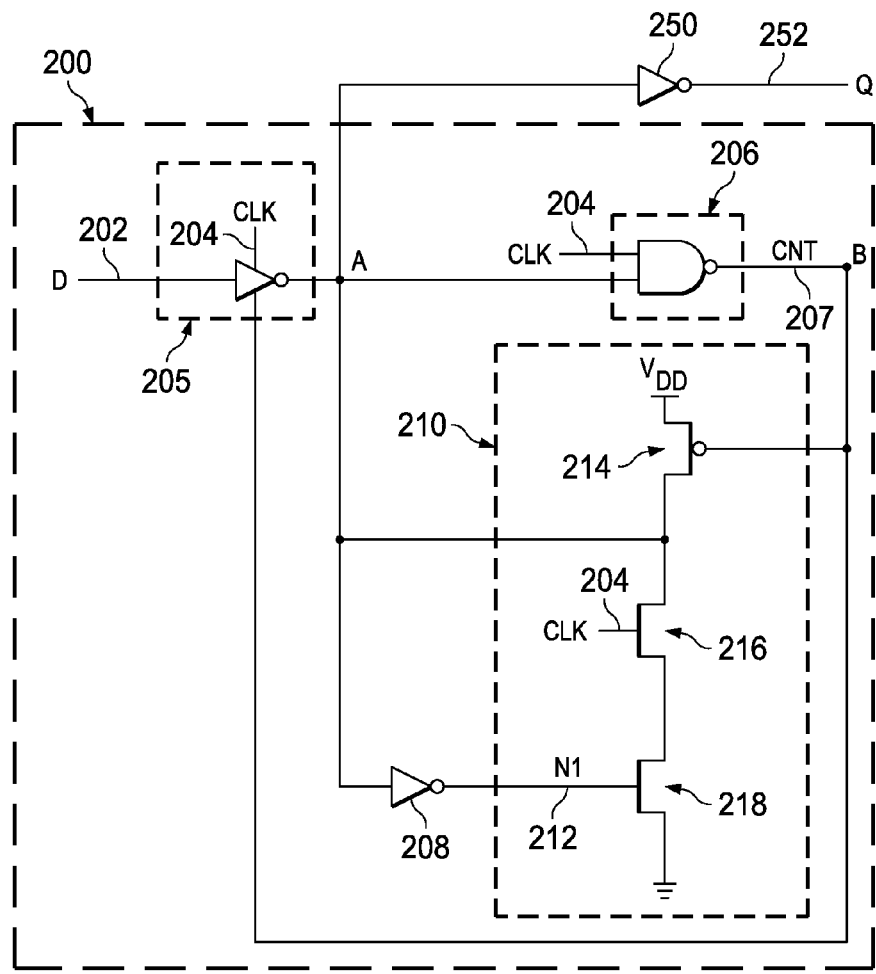
Figure 3:
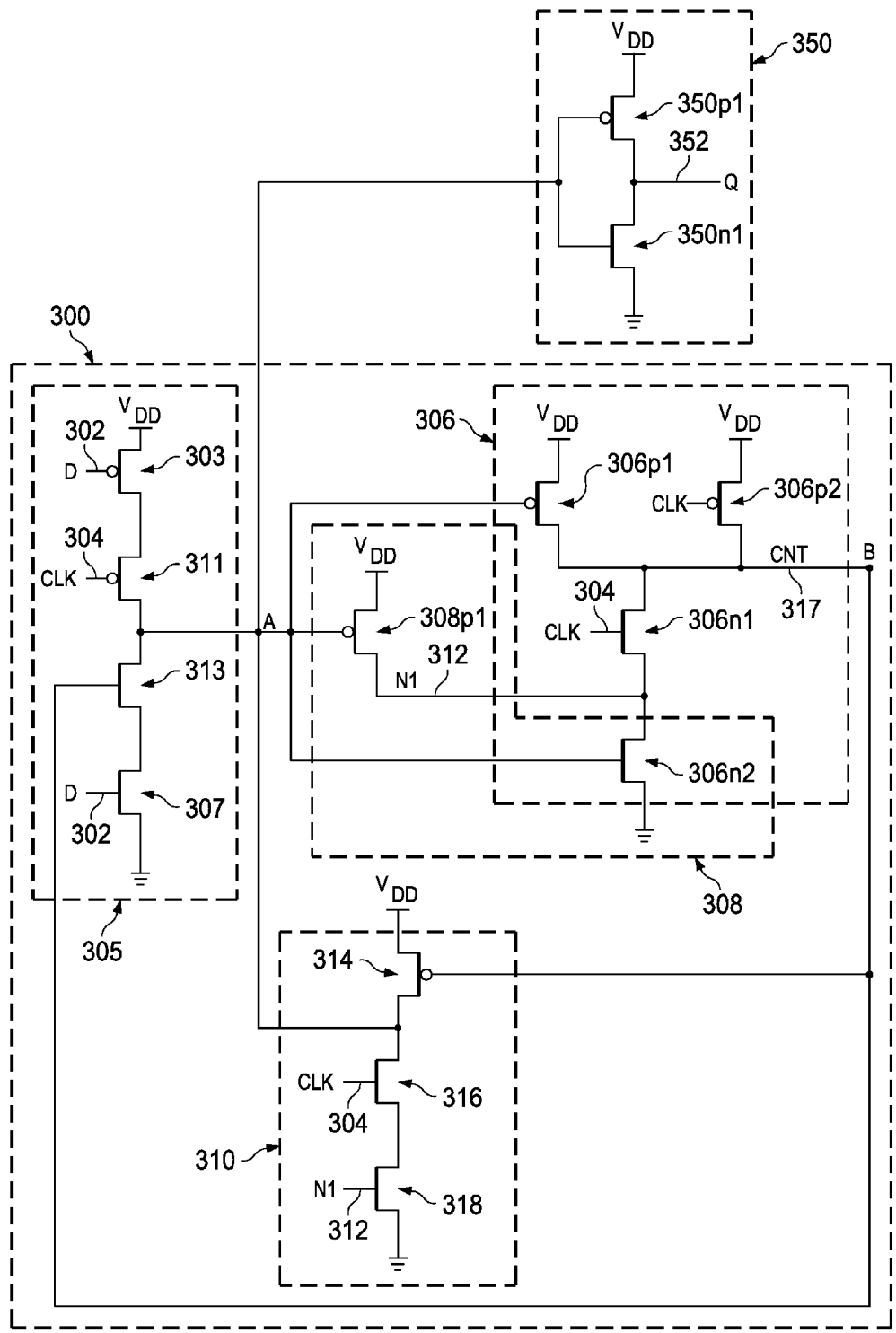
Figure 4:
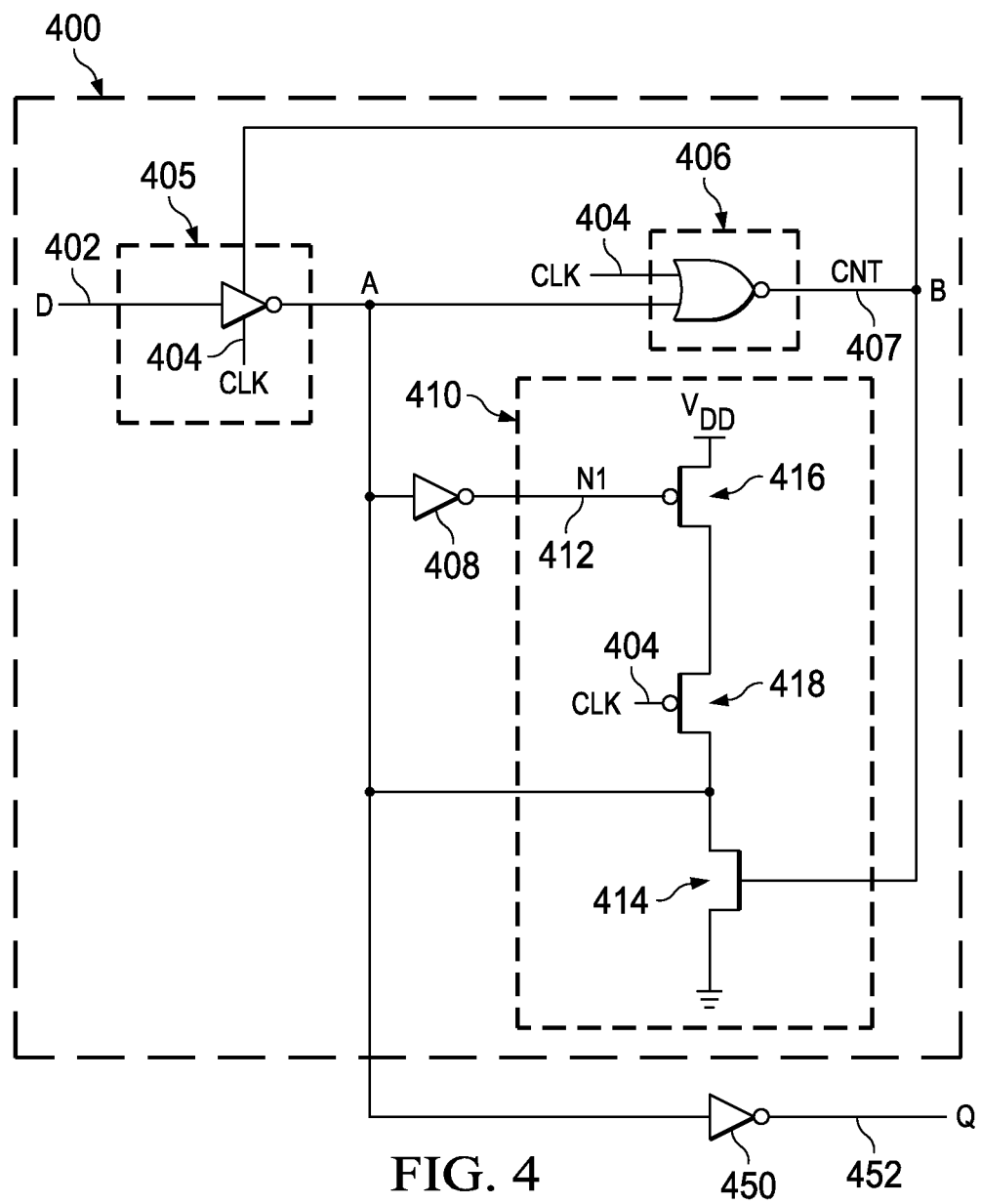
Figure 5:
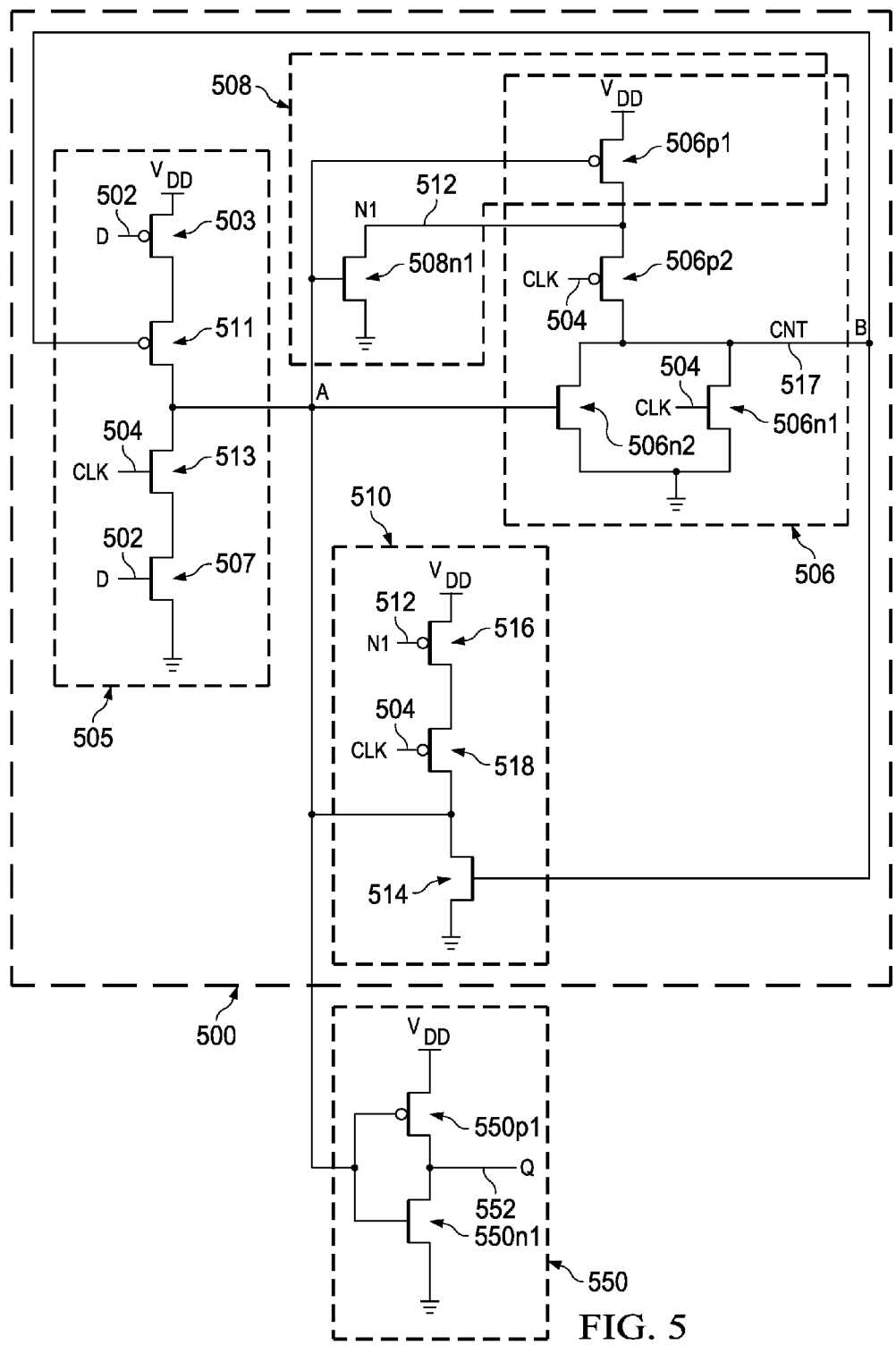
Figure 6:
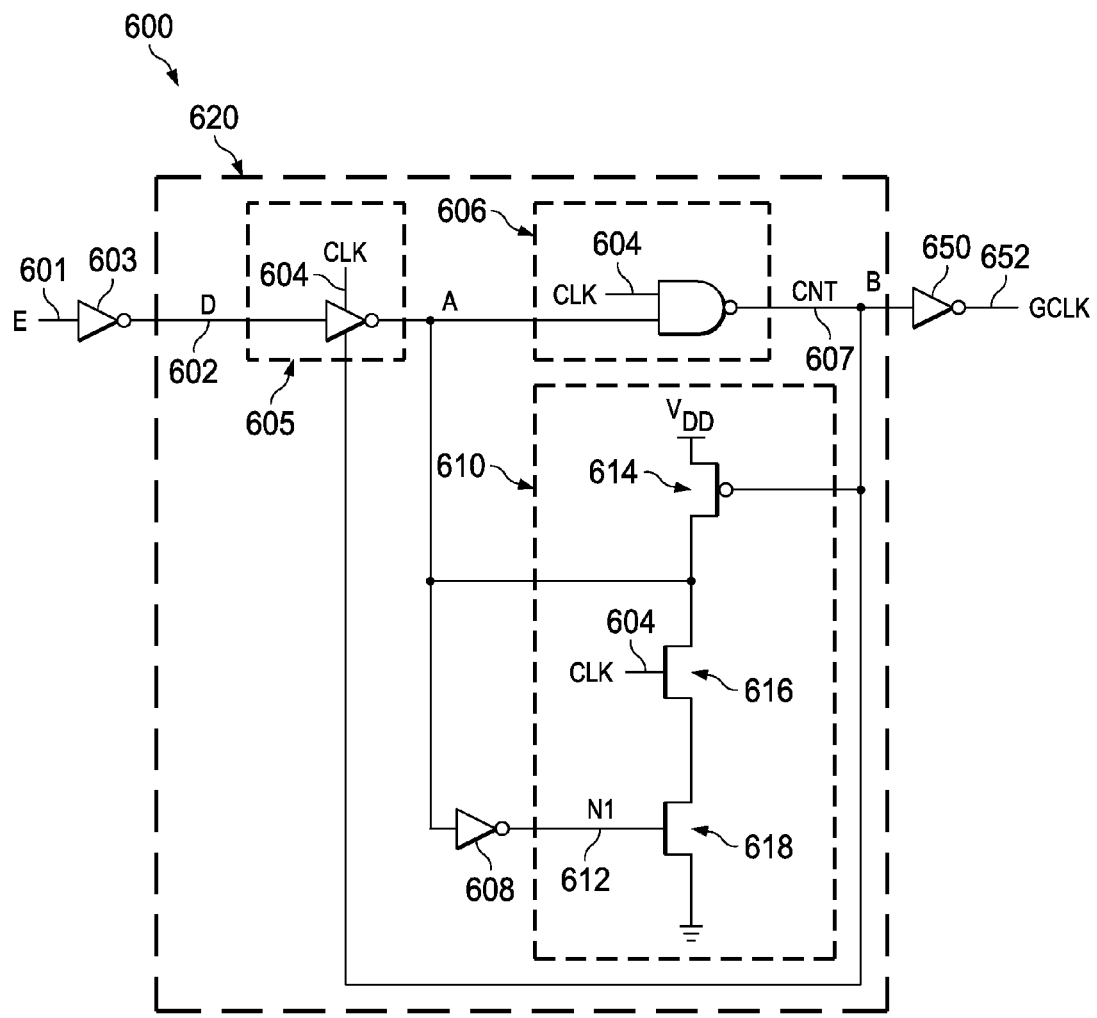
Figure 7:
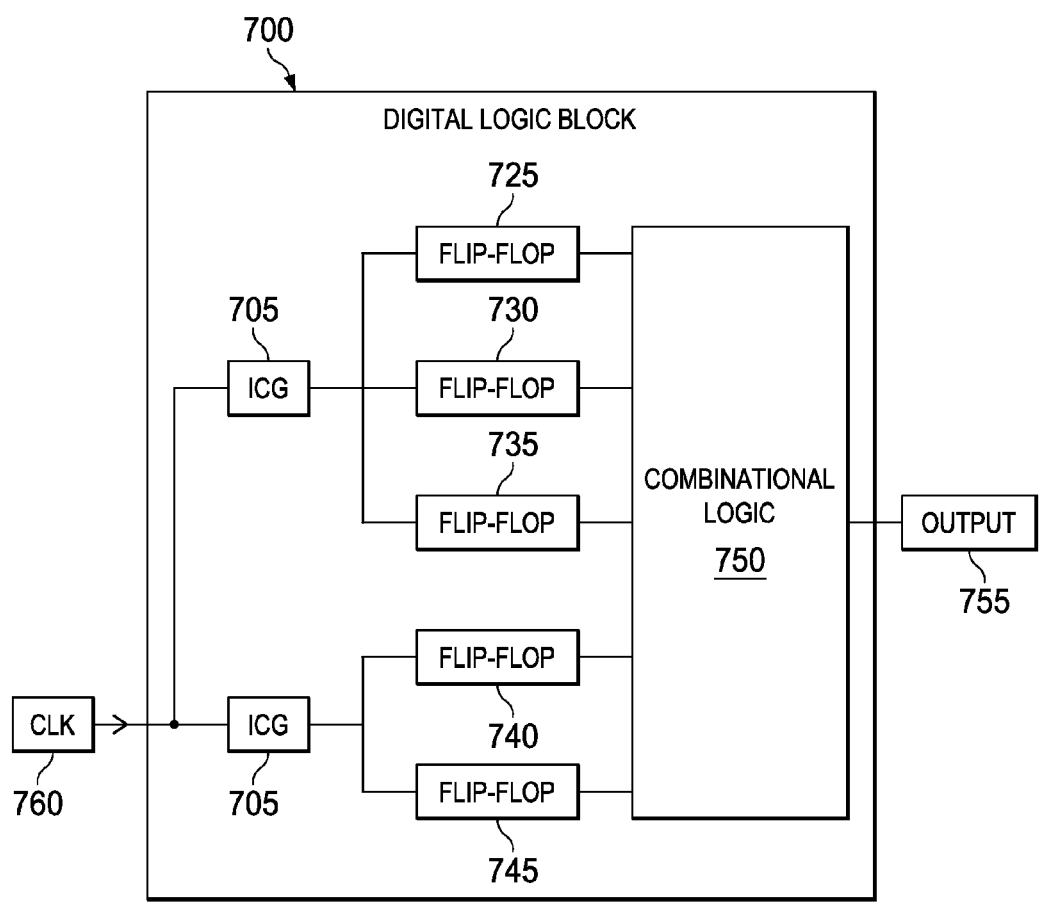

FIG. 1 illustrates a schematic of a latch;
FIG. 2 illustrates a schematic of a latch, according to an embodiment;
FIG. 3 illustrates a schematic of a transistor level implementation of a latch, according to an embodiment;
FIG. 4 illustrates a schematic of a latch, according to an embodiment;
FIG. 5 illustrates a schematic of a transistor level implementation of a latch, according to an embodiment;
FIG. 6 illustrates a schematic of an integrated clock gating (ICG) cell, according to an embodiment; and
FIG. 7 illustrates a schematic of a digital logic block, according to an embodiment.

DETAILED DESCRIPTION OF THE EMBODIMENTS

FIG. 1 illustrates a schematic of a latch 100. The latch 100 includes a first tri-state inverter 105 that receives a latch input D 102, a clock input CLK 104 and an inverted clock input CLKZ 108. A node 'A' is coupled to the first tri-state inverter 105. A first inverter 106 is coupled to the node 'A'. The first inverter 106 receives an output of the first tri-state inverter 105. A node 'B' receives an output of the first inverter 106. A second tri-state inverter 110 is coupled to the node 'B' and receives the output of the first inverter 106. The second tri-state inverter 110 receives the clock input CLK 104 and the inverted clock input CLKZ 108.

The node 'A' receives an output of the second tri-state inverter 110. An output inverter 150 is coupled to the latch 100. The output inverter 150 is coupled to the node 'A' and receives the output of the first tri-state inverter 105. The output inverter 150 generates a latch output Q 152. A second inverter 115 receives the clock input CLK 104 and generates the inverted clock input CLKZ 108.

The operation of the latch 100 illustrated in FIG. 1 is explained now. When the latch input D 102 is at logic '0' and the clock input CLK 104 is at logic '0', the output of the first tri-state inverter 105 is logic '1'. Thus, node 'A' is at logic '1'. The first inverter 106 generates a logic '0' at node 'B'. The second tri-state inverter 110 is deactivated when the clock input CLK 104 is at logic '0'. The output inverter 150 generates the latch output Q 152 which is at logic '0'. The inverted clock input CLKZ 108 is generated in the latch 100 using the second inverter 115. The inverted clock input CLKZ 108 is at logic '1'

The inverted clock input CLKZ 108 is provided to the first tri-state inverter 105 and the second tri-state inverter 110. All the logic blocks described above are implemented using transistors. The latch is the basis of an integrated clock gating (ICG) cell. It will be apparent that the power consumption of the ICG cell can be reduced if a number of transistors in the latch 100 are reduced in some way provided the functionality of the ICG cell remains the same. Also, reducing a number of transistors which receive the clock input CLK 104 or the inverted clock input CLKZ, will have a significant impact on power consumption of the ICG cell, since these transistors always switch with CLK and CLKZ irrespective of a transition in data.

As illustrated in FIG. 1, power consumption in the latch 100 is dependent on the transistors that receive a constant toggling input. For example, the first tri-state inverter 105, the second tri-state inverter 110 and the second inverter 115. At each of the first tri-state inverter 105 and the second tri-state inverter 110, two clock gate capacitances are present due to the constant toggling of both the clock input CLK 104 and the inverted clock input CLKZ 108.

At the second inverter 115, two clock gate capacitances are present, as two transistors receive the constant toggling clock input CLK 104. Therefore, a total of 6 gate capacitances are responsible for the power consumption in the latch 100. It is apparent that if the power consumption in the latch can be reduced, the overall power consumption of an ICG cell can be reduced.

FIG. 2 illustrates a schematic of a latch 200, according to an embodiment. In one example, the latch 200 is a low level triggered latch. The latch 200 includes a tri-state inverter 205. The tri-state inverter 205 receives a latch input (D) 202 and a clock input CLK 204. A node 'A' receives an output of the tri-state inverter 205. The node 'A' is coupled to an inverting logic gate 206. The inverting logic gate 206 receives the output of the tri-state inverter 205 and the clock input CLK 204.

An output of the inverting logic gate 206 is received at a node 'B'. A first inverter 208 is coupled to the node 'A' and receives the output of the tri-state inverter 205. The first inverter 208 generates a first inverted output N1 212.

A half tri-state inverter 210 includes a third PMOS transistor 214. A gate terminal of the third PMOS transistor 214 is coupled to the node 'B'. A third NMOS transistor 216 is coupled to a drain terminal of the third PMOS transistor 214. The drain terminal of third PMOS transistor 214 and a drain terminal of the third NMOS transistor 216 are coupled to node 'A' and receive the output of the tri-state inverter 205. A gate terminal of the third NMOS transistor receives the clock input CLK 204. A fourth NMOS transistor 218 is coupled to a source terminal of the third NMOS transistor 216. A gate terminal of the fourth NMOS transistor 218 is coupled to the first inverter 208 and receives the first inverted output N1 212. The source terminal of the fourth NMOS transistor 218 and a source terminal of the third PMOS transistor 214 are coupled to a ground and a power terminal ($V_{DD}$) respectively.

An output inverter 250 is coupled to the latch 200. The output inverter 250 is coupled to the node 'A' and generates a latch output Q 252. In one example, the latch 200 is configured to receive at least one of a clear signal and a preset signal. The clear signal clear the bit values stored in the latch 200. The preset signal restores the bit values stored in the latch 200 to predefined values. The latch 200 may include one or more additional components or inputs known to those skilled in the relevant art and are not discussed here for simplicity of the description.

The operation of the latch 200 illustrated in FIG. 2 is explained now. The tri-state inverter 205 inverts the latch input D 202 to generate the output of the tri-state inverter 205. The node 'A' receives the output of the tri-state inverter 205. The inverting logic gate 206 receives the clock input CLK 204 and the output of the tri-state inverter 205 and generates a control signal (CNT) 207.

In one embodiment, the inverting logic gate is a NAND gate. In another embodiment, the inverting logic gate 206 is a NAND gate when the latch 200 is a low level triggered latch and the inverting logic gate 206 is a NOR gate when the latch 200 is a high level triggered latch. The tri-state inverter 205 receives the control signal (CNT) 207. The control signal (CNT) 207 activates the tri-state inverter 205. In one example, the tri-state inverter 205 is activated on receiving the control signal (CNT) 207 and a defined phase of clock input CLK 204.

In one version, when the clock input CLK 204 is at logic '0' in a low level triggered latch, the control signal (CNT) 207 and the clock input CLK 204 activates the tri-state inverter 205 such that the output of the tri-state inverter 205 is inverse of the latch input D 202. The first inverter 208 receives the output of tri-state inverter 205 and generates the first inverted output N1 212. The output inverter 250 inverts the output of the tri-state inverter 205 to generate the latch output Q 252. When clock input CLK 204 is at logic '1' the tri-state inverter 205 is deactivated and the latch 200 holds the data by virtue of back to back inversions in inverting logic gate 206 and the half tri-state inverter 210.

The operation of the latch 200 is now explained with the help of logic states. In a first state, the clock input CLK 204 is at logic '0' and the latch input D 202 is at logic '0'. The output of the tri-state inverter 205 is at logic '1' i.e. node 'A' is at logic '1'. When the latch 200 is a low level triggered latch, the inverting logic gate 206 is a NAND gate. Thus, node 'B' is at logic '1' i.e. the control signal (CNT) 207 generated by the inverting logic gate 206 is at logic '1' when the clock input CLK 204 is at logic '0'.

The control signal (CNT) 207 and the clock input CLK 204 activates the tri-state inverter 205. The logic '1' at node 'B' deactivates the third PMOS transistor 214. Since the clock input CLK 204 is at logic '0', the third NMOS transistor 216 is deactivated. Also, the first inverted output N1 212 generated by the first inverter 208 is at logic '0' which deactivates the fourth NMOS transistor 218.

It is assumed that an initial value of the latch output Q 252 is logic '1'. The output inverter 250 receives the logic '1' from node 'A' and therefore the latch output Q 252 transitions to logic '0'.

In a second state, the clock input CLK 204 transitions to logic '1' and the latch input D 202 is still at logic '0'. The node 'A' continues to be at logic '1'. The output of the inverting logic gate 206 transitions to logic '0'. Thus, node 'B' is at logic '0' i.e. the control signal (CNT) 207 generated by the inverting logic gate 206 is at logic '0'. Thus, the control signal (CNT) 207 deactivates the tri-state inverter 205. The logic '0' at node 'B' activates the third PMOS transistor 214.

Thus, the drain terminal of the third PMOS transistor 214 is at logic '1' which is same as the logic at node 'A'. Thus, the node 'A' continues to be at logic '1' as it was in the first state. Thus, no ambiguity of logic occurs in the latch 200. Since the clock input CLK 204 is at logic '1', the third NMOS transistor 216 is activated but the first inverted output N1 212 generated by the first inverter 208 is at logic '0' which deactivates the fourth NMOS transistor 218. As long as the node 'A' and the clock input CLK 204 are at logic '1', the node 'B' remains at logic '0' and as long as the node 'B' is at logic '0', the logic '1' at node 'A' is retained and the latch output Q 252 remains at logic '0'.

In a third state, the clock input CLK 204 transitions to logic '0' and the latch input D 202 transition to logic '1' from logic '0'. The output of the inverting logic gate 206 is at logic '1' because the clock input CLK 204 is at logic '0'. Thus, node 'B' is at logic '1' i.e. the control signal (CNT) 207 generated by the inverting logic gate 206 is at logic '1'. This activates the tri-state inverter 205 and the node 'A' transitions to logic '0'. The logic '1' at node 'B' deactivates the third PMOS transistor 214. Since the clock input CLK 204 is at logic '0', the third NMOS transistor 216 is deactivated but the first inverted output N1 212 generated by the first inverter 208 is at logic '1' which activates the fourth NMOS transistor 218. The output inverter 250 inverts the logic '0' at node 'A' and therefore, the latch output Q 252 transitions to logic '1'.

In a fourth state, the clock input CLK 204 transitions to logic '1' and the latch input D 202 is still at logic '1'. In the third state, node 'A' was at logic '0'. Thus, the output of the inverting logic gate 206 remains at logic '1'. Thus, node 'B' is at logic '1' i.e. the control signal (CNT) 207 generated by the inverting logic gate 206 is at logic '1'. The control signal (CNT) 207 keeps the tri-state inverter 205 activated as long as the latch input D 202 is at logic '1'. This does not create ambiguity of logic as the latch input D 202 was at logic '1' before the clock input CLK 204 transitioned from logic '0' to logic '1' and thus the node 'A' is at logic '0'.

When the input 'D' is at logic '1', the control signal (CNT) 207 for the tri-state inverter 205 remains active even after the clock input CLK transitions to logic '1'. However, the latch input D 202 transitioning to logic '0' while the clock input CLK 204 is at logic '1' does not disturb the latch 200 as only a part of the tri-state inverter 205 is active. Thus, there is a feedback and retention path for node 'A' and the latch 200 remains at a correct logic even if the latch input D 202 transitions from logic '1' to logic '0' after the clock input CLK 204 has transitioned to logic '1', i.e., a retention of logic in the latch 200 is not dependent on the output of the tri-state inverter 205 when the clock input CLK 204 is at logic '1'.

The logic '1' at node 'B' deactivates the third PMOS transistor 214. Since the node 'A' is at logic '0', the output of first inverter 208, N1 212 is at logic '1' which activates the fourth NMOS transistor 218. The clock input CLK 204 is at logic '1' which activates the third NMOS transistor 216 and therefore the output of the half tri-state inverter 210 is at logic '0' which is same as the logic at node 'A'. Thus, the node 'A' continues to be at logic '0' i.e. same logic state is in the third state. Thus, no ambiguity of logic occurs in the latch 200.

The output inverter 250 receives the logic '0' from node 'A' and generates the latch output Q 252 which is at logic '1'. Therefore, the latch output Q 252 remains at logic '1'. The table 1 summarizes the states of the latch 200

TABLE 1

|  | Node 'A' | Node 'B' | Q | N1 |
|---|---|---|---|---|
| Clk = 0, D = 0 | 1 | 1 | 0 | 0 |
| Clk = 1, D = 0 | 1 | 0 | 0 | 0 |
| Clk = 0, D = 1 | 0 | 1 | 1 | 1 |
| Clk = 1, D = 1 | 0 | 1 | 1 | 1 |

FIG. 3 illustrates a schematic of a transistor level implementation of a latch 300, according to an embodiment. The latch 300 is a transistor level implementation of the latch 200. The latch 300 includes a tri-state inverter 305. The tri-state inverter 305 receives a latch input (D) 302 and a clock input CLK 304.

The tri-state inverter 305 includes a first PMOS transistor 303 and a first NMOS transistor 307. A gate terminal of the first PMOS transistor 303 and a gate terminal of the first NMOS transistor 307 receive the latch input (D) 302. A second PMOS transistor 311 is coupled to a drain terminal of the first PMOS transistor 303 and a second NMOS transistor 313 is coupled to a drain terminal of the first NMOS transistor 307. A drain terminal of the second PMOS transistor 311 and a drain terminal of the second NMOS transistor 313 are coupled to generate an output of the tri-state inverter 305. A source terminal of the first PMOS transistor 303 is coupled to a power terminal ($V_{DD}$) and a source terminal of the first NMOS transistor 307 is coupled to a ground terminal.

When the latch 300 is a low level triggered latch, a gate terminal of the second PMOS transistor 311 receives the clock input CLK 304 and a gate terminal of the second NMOS transistor 313 receives a control signal (CNT) 317. A node 'A' receives the output of the tri-state inverter 305. The node 'A' is coupled to an inverting logic gate 306. The inverting logic gate 306 receives the output of the tri-state inverter 305 and the clock input CLK 304.

The inverting logic gate 306 includes a PMOS transistor 306p1, an NMOS transistor 306n1, a PMOS transistor 306p2 and an NMOS transistor 306n2. A gate terminal of the PMOS transistor 306p1 and a gate terminal of the NMOS transistor 306n2 receive the output of the tri-state inverter 305. A gate terminal of the PMOS transistor 306p2 and a gate terminal of the NMOS transistor 306n1 receive the clock input CLK 304. A source terminal of the PMOS transistor 306p1 and a source terminal of the PMOS transistor 306p2 are coupled to the power terminal ($V_{DD}$). A source terminal of the NMOS transistor 306n2 is coupled to the ground terminal and a drain terminal of 306n2 is coupled to a source terminal of 306n1. A drain terminal of the PMOS transistor 306p1 and a drain terminal of the PMOS transistor 306p2 are coupled to a drain terminal of the NMOS transistor 306n1 to generate the control signal (CNT) 317 at node 'B'.

An output of the inverting logic gate 306 is received by a node 'B' which is the control signal (CNT) 317. A first inverter 308 is coupled to node 'A' and receives the output of the tri-state inverter 305. The first inverter 308 includes a PMOS transistor 308p1 and the NMOS transistor 306n2. A gate terminal of the PMOS transistor 308p1 and a gate terminal of the NMOS transistor 306n2 receive the output of the tri-state inverter 305. The first inverter 308 generates a first inverted output N1 312.

A half tri-state inverter 310 is coupled to the node 'B'. The half tri-state inverter 310 includes a third PMOS transistor 314. A gate terminal of the third PMOS transistor 314 is coupled to the node 'B'. A third NMOS transistor 316 is coupled to a drain terminal of the third PMOS transistor 314. The drain terminal of the third PMOS transistor 314 and a drain terminal of the third NMOS transistor 316 are coupled to each other and to the node 'A'. A gate terminal of the third NMOS transistor 316 receives the clock input CLK 304.

A fourth NMOS transistor 318 is coupled to a source terminal of the third NMOS transistor 316. A gate terminal of the fourth NMOS transistor 318 is coupled to the first inverter 308 and receives the first inverted output N1 312. The source terminal of the third NMOS transistor 316 is coupled to a drain terminal of the fourth NMOS transistor 318. The source terminal of the fourth NMOS transistor 318 and a source terminal of the third PMOS transistor 314 are coupled to the ground terminal and the power terminal ($V_{DD}$) respectively.

An output inverter 350 is coupled to the latch 300. The output inverter 350 is coupled to the node 'A' and generates a latch output Q 352. The output inverter 350 includes a PMOS transistor 350p1 and an NMOS transistor 350n1. A gate terminal of the PMOS transistor 350p1 and a gate terminal of the NMOS transistor 350n1 are configured to receive the output of the tri-state inverter 305. A source terminal of the PMOS transistor 350p1 is coupled to the power terminal ($V_{DD}$) and a source terminal of the NMOS transistor 350n1 is coupled to the ground terminal.

A drain terminal of the PMOS transistor 350p1 and a drain terminal of the NMOS transistor 350n1 are coupled to generate the latch output Q 352. In one example, latch 300 is configured to receive at least one of a clear signal and a preset signal. The clear signal clears the bit values stored in the latch 300. The preset signal restores the bit values stored in the latch 300 to predefined values. The operation of the latch 300 is similar to the operation of the latch 200 and is thus not explained here for brevity of the description.

FIG. 4 illustrates a schematic of a latch 400, according to an embodiment. In one example, the latch 400 is a high level triggered latch. The latch 400 includes a tri-state inverter 405. The tri-state inverter 405 receives a latch input (D) 402 and a clock input CLK 404. A node 'A' receives the output of the tri-state inverter 405. The node 'A' is coupled to an inverting logic gate 406. The inverting logic gate 406 receives the output of the tri-state inverter 405 and the clock input CLK 404. An output of the inverting logic gate 406 is received at a node 'B'. A first inverter 408 is coupled to the node 'A' and receives the output of the tri-state inverter 405. The first inverter 408 generates a first inverted output N1 412.

A half tri-state inverter 410 includes a third NMOS transistor 414. A gate terminal of the third NMOS transistor 414 is coupled to the node 'B'. A fourth PMOS transistor 418 is coupled to a drain terminal of the third NMOS transistor 414. A gate terminal of the fourth PMOS transistor 418 receives the clock input CLK 404. A third PMOS transistor 416 is coupled to a source terminal of the fourth PMOS transistor 418. A gate terminal of the third PMOS transistor 416 is coupled to the first inverter 408 and receives the first inverted output N1 412.

The drain terminal of third NMOS transistor 414 and a drain terminal of fourth PMOS transistor 418 are coupled to node 'A' and receive the output of the tri-state inverter 405. The source terminal of the third PMOS transistor 416 and a source terminal of the third NMOS transistor 414 are coupled to a power terminal ($V_{DD}$) and a ground respectively.

An output inverter 450 is coupled to the latch 400. The output inverter 450 is coupled to the node 'A' and generates a latch output Q 452. In one example, the latch 400 is configured to receive at least one of a clear signal and a preset signal. The clear signal clear the bit values stored in the latch 400. The preset signal restores the bit values stored in the latch 400 to predefined values. The latch 400 may include one or more additional components or inputs known to those skilled in the relevant art and are not discussed here for simplicity of the description.

The operation of the latch 400 illustrated in FIG. 4 is explained now. The tri-state inverter 405 inverts the latch input D 402 to generate the output of the tri-state inverter 405. The node 'A' receives the output of the tri-state inverter 405. The inverting logic gate 406 receives the clock input CLK 404 and the output of the tri-state inverter 405 and generates a control signal (CNT) 407.

In this embodiment, the inverting logic gate is a NOR gate. The tri-state inverter 405 receives the control signal (CNT) 407. The control signal (CNT) 407 activates the tri-state inverter 405. In one example, the tri-state inverter 405 is activated on receiving the control signal (CNT) 407 and a defined phase of clock input CLK 404.

In one version, when the clock input CLK 404 is at logic '1' in a high level triggered latch, the control signal (CNT) 407 and the clock input CLK 404 activates the tri-state inverter 405 such that the output of the tri-state inverter 405 is inverse of the latch input D 402. The first inverter 408 receives the output of tri-state inverter 405 and generates a first inverted output N1 412. The output inverter 450 inverts the output of the tri-state inverter 405 to generate the latch output Q 452. When the clock input CLK 404 is at logic '0', the data is retained in the latch 400 by virtue of back-to-back inversions performed by the inverting logic gate 406 and the half tri-state inverter 410.

The operation of the latch 400 is now explained with the help of logic states. In a first state, the clock input CLK 404 is at logic '1' and the latch input D 402 is at logic '1'. The output of the tri-state inverter 405 is at logic '0' i.e. node 'A' is at logic '0'. When the latch 400 is a high level triggered latch, the inverting logic gate 406 is a NOR gate.

Since the clock input CLK 404 is at logic '1', node 'B' is at logic '0' i.e. the control signal (CNT) 407 generated by the inverting logic gate 406 is at logic '0'. The control signal (CNT) 407 and the clock input CLK 404 activates the tri-state inverter 405. The logic '0' at node B' deactivates the third NMOS transistor 414. Since the clock input CLK 404 is at logic '1', the fourth PMOS transistor 418 is deactivated. Also, the first inverted output N1 412 generated by the first inverter 408 is at logic '1' which deactivates the third PMOS transistor 416.

It is assumed that an initial value of the latch output Q 452 is logic '0'. The output inverter 450 receives the logic '0' from node 'A' and therefore the latch output Q 452 transitions to logic '1'.

In a second state, the clock input CLK 404 transitions to logic '0' and the latch input D 402 is still at logic '1'. The node 'A' continues to be at logic '0'. The output of the inverting logic gate 406 transitions to logic '1'. Thus, node 'B' is at logic '1' i.e. the control signal (CNT) 407 generated by the inverting logic gate 406 is at logic '1'. Thus, the control signal (CNT) 407 deactivates the tri-state inverter 405. The logic '1' at node 'B' activates the third NMOS transistor 414 and therefore, the half tri-state inverter 410 generates logic '0'.

Thus, the node 'A' continues to be at logic '0' as it was in the first state. Thus, no ambiguity of logic occurs in the latch 400. Since the clock input CLK 404 is at logic '0', the fourth PMOS transistor 418 is activated but the first inverted output N1 412 generated by the first inverter 408 is at logic '1' which deactivates the third PMOS transistor 416.

As long as the node 'A' and the clock input CLK 404 are at logic '0', the node 'B' remains at logic '1' and as long as the node 'B' is at logic '1', the latch output Q 452 remains at logic '1'.

In a third state, the clock input CLK 404 transition to logic '1' and the latch input D 402 transitions to logic '0' from logic '1'. The output of the inverting logic gate 406 is at logic '0' because the clock input CLK 404 is at logic '1'. Thus, node 'B' is at logic '0' i.e. the control signal (CNT) 407 generated by the inverting logic gate 406 is at logic '0'. This activates the tri-state inverter 405 and the node 'A' transitions to logic '1'. The logic '0' at node 'B' deactivates the third NMOS transistor 414. Since the clock input CLK 404 is at logic '1', the fourth PMOS transistor 418 is deactivated. The output inverter 450 inverts logic '1' at node 'A'. Thus, the latch output Q 452 transitions to logic '0'.

In a fourth state, the clock input CLK 404 transitions to logic '0' and the latch input D 402 is still at logic '0'. In the third state, node 'A' was at logic '1'. Thus, the output of the inverting logic gate 406 remains at logic '0'. Thus, node 'B' is at logic '0' i.e. the control signal (CNT) 407 generated by the inverting logic gate 406 is at logic '0'. The control signal (CNT) 407 keeps the tri-state inverter 405 activated as long as the latch input D 402 is at logic '0'. This does not create ambiguity of logic as the latch input D 402 was at logic '0' before the clock input CLK 404 transitioned from logic '1' to logic '0' and thus the node 'A' is at logic '1'.

When the latch input D 402 is at logic '0', the control signal (CNT) 407 for the tri-state inverter 405 remains active even after the clock input CLK transitions to logic '0'. However, the latch input D 402 transitioning to logic '1' while the clock input CLK 404 is at logic '0' does not disturb the latch 400 as only a part of the tri-state inverter 405 is active. Thus, there is a feedback and retention path for node 'A' and the latch 400 remains at a correct logic even if the latch input D 402 transitions from logic '0' to logic '1' after the clock input CLK 404 has transitioned to logic '0', i.e., a retention of logic in the latch 400 is not dependent on the output of the tri-state inverter 405.

The logic '0' at node 'B' deactivates the third NMOS transistor 414. Since the node 'A' is at logic '1', the output of first inverter 408, N1 412 is at logic '0' which activates the third PMOS transistor 416. The clock input CLK 404 is at logic '0' which activates the fourth PMOS transistor 418 and therefore the output of the half tri-state inverter 410 is at logic '1' which is same as the logic at node 'A'. Thus, the node 'A' continues to be at logic '1' i.e. same logic state is in the third state. Thus, no ambiguity of logic occurs in the latch 400.

The output inverter 450 receives the logic '1' from node 'A' and generates the latch output Q 452 which is at logic '0'. Therefore, the latch output Q 452 remains at logic '0'. The table 2 summarizes the states of the latch 400

TABLE 2

|  | Node 'A' | Node 'B' | Q | N1 |
|---|---|---|---|---|
| Clk = 1, D = 1 | 0 | 0 | 1 | 1 |
| Clk = 0, D = 1 | 0 | 1 | 1 | 1 |
| Clk = 1, D = 0 | 1 | 0 | 0 | 0 |
| Clk = 0, D = 0 | 1 | 0 | 0 | 0 |

FIG. 5 illustrates a schematic of a transistor level implementation of a latch 500, according to an embodiment. The latch 500 is a transistor level implementation of the latch 400. The latch 500 includes a tri-state inverter 505. The tri-state inverter 505 receives a latch input (D) 502 and a clock input CLK 504.

The tri-state inverter 505 includes a first PMOS transistor 503 and a first NMOS transistor 507. A gate terminal of the first PMOS transistor 503 and a gate terminal of the first NMOS transistor 507 receive the latch input (D) 502. A second PMOS transistor 511 is coupled to a drain terminal of the first PMOS transistor 503 and a second NMOS transistor 513 is coupled to a drain terminal of the first NMOS transistor 507.

A drain terminal of the second PMOS transistor 511 and a drain terminal of the second NMOS transistor 513 are coupled to generate an output of the tri-state inverter 505. A source terminal of the first PMOS transistor 503 is coupled to a power terminal ($V_{DD}$) and a source terminal of the first NMOS transistor 507 is coupled to a ground terminal.

When the latch 500 is a high level triggered latch, the gate terminal of the second PMOS transistor 511 receives a control signal (CNT) 517 and the gate terminal of the second NMOS transistor 513 receives the clock input CLK 504.

A node 'A' receives the output of the tri-state inverter 505. The node 'A' is coupled to an inverting logic gate 506. The inverting logic gate 506 receives the output of the tri-state inverter 505 and the clock input CLK 504.

The inverting logic gate 506 includes a PMOS transistor 506p1, an NMOS transistor 506n1, a PMOS transistor 506p2 and an NMOS transistor 506n2. A gate terminal of the PMOS transistor 506p1 and a gate terminal of the NMOS transistor 506n2 receive the output of the tri-state inverter 505. A gate terminal of the PMOS transistor 506p2 and a gate terminal of the NMOS transistor 506n1 receive the clock input CLK 504.

A source terminal of the PMOS transistor 506p1 is coupled to the power terminal ($V_{DD}$). A source terminal of the NMOS transistor 506n2 and a source terminal of the NMOS transistor 506n1 are coupled to the ground terminal. A drain terminal of the PMOS transistor 506p1 is coupled to a source terminal of the PMOS transistor 506p2. A drain terminal of the PMOS transistor 506p2 and a drain terminal of the NMOS transistor 506n1 are coupled to a drain terminal of the NMOS transistor 506n2 to generate the control signal (CNT) 517 at node 'B'

An output of the inverting logic gate 506 is received at a node 'B' which is the control signal (CNT) 517. A first inverter 508 is coupled to node 'A' and receives the output of the tri-state inverter 505. The first inverter 508 includes a PMOS transistor 506p1 and the NMOS transistor 508n1.

A gate terminal of the PMOS transistor 506p1 and a gate terminal of the NMOS transistor 508n1 receive the output of the tri-state inverter 505. The first inverter 508 generates a first inverted output N1 512. A drain terminal of the PMOS transistor 506p1 and a source terminal of the PMOS transistor 506p2 are coupled to a drain terminal of the NMOS transistor 508n1.

A half tri-state inverter 510 includes a third NMOS transistor 514. A gate terminal of the third NMOS transistor 514 is coupled to the node 'B'. A drain terminal of third PMOS transistor 516 is coupled to a drain terminal of the third NMOS transistor 514. A gate terminal of the third PMOS transistor 516 receives the clock input CLK 504. A drain terminal of fourth PMOS transistor 518 is coupled to a source terminal of the third PMOS transistor 516. A gate terminal of the fourth PMOS transistor 518 is coupled to the first inverter 508 and receives the first inverted output N1 512. The source terminal of the third PMOS transistor 516 is coupled to a drain terminal of the fourth PMOS transistor 518 to form a node 'N2'. The drain terminal of the third PMOS transistor 516 and the drain terminal of the third NMOS transistor 514 are coupled to node 'A'. The source terminal of the fourth PMOS transistor 518 and a source terminal 514 of the third NMOS transistor 514 are coupled to the power terminal ($V_{DD}$) and the ground terminal respectively.

An output inverter 550 is coupled to the latch 500. The output inverter 550 is coupled to the node 'A' and generates a latch output Q 552. The output inverter 550 includes a PMOS transistor 550p1 and an NMOS transistor 550n1. A gate terminal of the PMOS transistor 550p1 and a gate terminal of the NMOS transistor 550n1 are configured to receive the output of the tri-state inverter 505. A source terminal of the PMOS transistor 550p1 is coupled to the power terminal ($V_{DD}$) and a source terminal of the NMOS transistor 550n1 is coupled to the ground terminal.

A drain terminal of the PMOS transistor 550p1 and a drain terminal of the NMOS transistor 550n1 are coupled to generate the latch output Q 552. In one example, the latch 500 is configured to receive at least one of a clear signal and a preset signal. The clear signal clear the bit values stored in the latch 500. The preset signal restores the bit values stored in the latch 500 to predefined values. The operation of the latch 500 is similar to the operation of the latch 400 and is thus not explained here for brevity of the description.

FIG. 6 illustrates an integrated clock gating (ICG) cell 600, according to an embodiment. The ICG cell 600 includes a first logic gate 603, a latch 620 and a second logic gate 650. The first logic gate 603 receives an enable signal E 601 and generates a latch input D 602. The latch 620 is coupled to the first logic gate 603 and receives the latch input D 602. The latch 620 is similar to the latch 200 (illustrated in FIG. 2) in connection and operation. It is noted that the latch 620 can be a low level triggered latch such as latch 200 or a high level triggered latch such as latch 400. The embodiments discussed in connection with FIG. 2 to FIG. 5 are applicable to the latch 620 and variations, and alternative constructions are apparent and well within the spirit and scope of the disclosure.

It is understood that the latch 620 is similar in connection and operation to the latch 200, according to an example embodiment. In other embodiment, the latch 620 is similar in connection and operation to at least one of the latch 300, latch 400 and latch 500. The second logic gate 650 is coupled to the latch 620 and receives an output of the latch 620. The second logic gate 650 generates a gated clock GCLK 652.

The latch 620 includes a tri-state inverter 605. The tri-state inverter 605 receives a latch input (D) 602 and a clock input CLK 604. A node 'A' receives an output of the tri-state inverter 605. The node 'A' is coupled to an inverting logic gate 606. The inverting logic gate 606 receives the output of the tri-state inverter 605 and the clock input CLK 604.

An output of the inverting logic gate 606 is received a control signal (CNT) 607 generated at a node 'B'. A first inverter 608 is coupled to the node 'A' and receives the output of the tri-state inverter 605. The first inverter 608 generates a first inverted output N1 612.

A half tri-state inverter 610 includes a third PMOS transistor 614. A gate terminal of the third PMOS transistor 614 is coupled to the node 'B'. A third NMOS transistor 616 is coupled to a drain terminal of the third PMOS transistor 614. The drain terminal of third PMOS transistor 614 and a drain terminal of third NMOS transistor 616 are coupled to node 'A' and receive the output of the tri-state inverter 605. A gate terminal of the third NMOS transistor 616 receives the clock input CLK 604. A fourth NMOS transistor 618 is coupled to a source terminal of the third NMOS transistor 616. A gate terminal of the fourth NMOS transistor 618 is coupled to the first inverter 608 and receives the first inverted output N1 612. The source terminal of the fourth NMOS transistor 618 and a source terminal of the third PMOS transistor 614 are coupled to a ground and a power terminal ($V_{DD}$) respectively.

The second logic gate 650 is coupled to the latch 620. The second logic gate 650 is coupled to the node 'B' and generates the gated clock GCLK 652. In one example, the latch 620 is configured to receive at least one of a clear signal and a preset signal. The clear signal clear the bit values stored in the latch 620. The preset signal restores the bit values stored in the latch 620 to predefined values. The latch 620 may include one or more additional components or inputs known to those skilled in the relevant art and are not discussed here for simplicity of the description.

The operation of the ICG cell 600 illustrated in FIG. 6 is explained now. The first logic gate 603 inverts the enable signal E 601 to generate the latch input D 602. In one example, the first logic gate 603 is an inverting logic gate. In another example, the first logic gate 603 receives the enable signal E 601 and a test enable signal TE. The first logic gate 603 in this example is an OR gate or a NOR gate. The latch input D 602 is received by the latch 620.

In this embodiment, the latch 620 is a low level triggered latch. The tri-state inverter 605 inverts the latch input D 602 to generate the output of the tri-state inverter 605. The node 'A' receives the output of the tri-state inverter 605. The inverting logic gate 606 receives the clock input CLK 604 and the output of the tri-state inverter 605 and generates the control signal (CNT) 607.

In this embodiment, the inverting logic gate 606 is a NAND gate. In another embodiment, the inverting logic gate 606 is a NAND gate when the latch 620 is a low level triggered latch and the inverting logic gate 606 is a NOR gate when the latch 620 is a high level triggered latch. The tri-state inverter 605 receives the control signal (CNT) 607. The control signal (CNT) 607 activates the tri-state inverter 605. In one example, the tri-state inverter 605 is activated on receiving the control signal (CNT) 607 and a defined phase of clock input CLK 604.

In one version, when the clock input CLK 604 is at logic '0' in a low level triggered latch, the control signal (CNT) 607 and the clock input CLK 604 activates the tri-state inverter 605 such that the output of the tri-state inverter 605 is inverse of the latch input D 602. The first inverter 608 receives the output of tri-state inverter 605 and generates the first inverted output N1 612. The second logic gate 650 inverts the output of the inverting logic gate 606 to generate the gated clock GCLK 652. The gated clock GCLK 652 is an output of the ICG cell 600.

The second logic gate 650 is coupled to the node 'B' and receives the control signal (CNT) 607 from the latch 620. The second logic gate 650 inverts the control signal (CNT) 607 to generate the gated clock GCLK 652. In one example, the second logic gate 650 is an inverting logic gate.

The operation of the ICG cell 600 is now explained with the help of logic states. In a first state, the clock input CLK 604 is at logic '0' and the enable signal E 601 is at logic '0'. The latch input D 602 generated by the first logic gate 603 is at logic '1'. The output of the tri-state inverter 605 is at logic '0' i.e. node 'A' is at logic '0'. When the latch 620 is a low level triggered latch, the inverting logic gate 606 is a NAND gate. Thus, node 'B' is at logic '1' i.e. the control signal (CNT) 607 generated by the inverting logic gate 606 is at logic '1' because the clock input CLK 604 is at logic '0'.

The control signal (CNT) 607 and the clock input CLK 604 activates the tri-state inverter 605. The logic '1' at node 'B' deactivates the third PMOS transistor 614. Since the clock input CLK 604 is at logic '0', the third NMOS transistor 616 is deactivated.

It is assumed that an initial value of the gated clock GCLK 652 is logic '1'. The second logic gate 650 receives the logic '1' from node 'B' and therefore the gated clock GCLK 652 transitions to logic '0'.

In a second state, the clock input CLK 604 transitions to logic '1' and the enable signal E 601 is still at logic '0'. The latch input D 602 generated by the first logic gate 603 continues to be at logic '1'. The node 'A' continues to be at logic '0' and thus the first inverted output N1 212 is at logic '1'. The output of the inverting logic gate 606 continues to be at logic '1'. Thus, node 'B' is at logic '1' i.e. the control signal (CNT) 607 generated by the inverting logic gate 606 is at logic '1'. The logic '1' at node 'B' deactivates the third PMOS transistor 614.

The node 'A' continues to be at logic '0' because the clock input CLK is at logic '1' which activates 616 and the first inverted output N1 212 is at logic '1' which activates the fourth NMOS transistor 618, as it was in the first state. Thus, no ambiguity of logic occurs in the latch 620. Since the clock input CLK 604 is at logic '1', the third NMOS transistor 616 is activated and the first inverted output N1 612 generated by the first inverter 608 is at logic '1' which activates the fourth NMOS transistor 618. As long as the node 'A' is at logic '0', the node 'B' remains at logic '1' and as long as the node 'B' is at logic '1', the gated clock GCLK 652 remains at logic '0'.

In a third state, the clock input CLK 604 transitions to logic '0' and the enable signal E 601 transition to logic '1' from logic '0'. The latch input D 602 generated by the first logic gate 603 transitions to logic '0'. The output of the inverting logic gate 606 is at logic '1' because the clock input CLK 604 is at logic '0'. Thus, node 'B' is at logic '1' i.e. the control signal (CNT) 607 generated by the inverting logic gate 606 is at logic '1'. This activates the tri-state inverter 605 and the node 'A' transitions to logic '1'. The logic '1' at node 'B' deactivates the third PMOS transistor 614. Since the clock input CLK 604 is at logic '0', the third NMOS transistor 616 is deactivated. Also the first inverted output N1 612 generated by the first inverter 608 is at logic '0' which deactivates the fourth NMOS transistor 618. The second logic gate 650 receives the logic '1' from node 'B' and therefore the gated clock GCLK 652 is at logic '0'.

In a fourth state, the clock input CLK 604 transitions to logic '1' and the enable signal E 601 is still at logic '1'. In the third state, node 'A' was at logic '1'. Thus, the output of the inverting logic gate 606 transitions to logic '0'. Thus, node 'B' is at logic '0' i.e. the control signal (CNT) 607 generated by the inverting logic gate 606 is at logic '0'. The control signal (CNT) 607 deactivates the tri-state inverter 605. Thus, node 'A' continues to be at logic '1' because logic '0' at node B activates the third PMOS transistor 614. This does not create ambiguity of logic as the latch input D 602 was at logic '0' before the clock input CLK 604 transitioned from logic '0' to logic '1' and the node 'A' was at logic '1'.

When the latch input D 602 is at logic '1' and the control signal (CNT) 607 for the tri-state inverter 605 is at logic '1', the node 'A' in the latch 620 is not disturbed as only a part of the tri-state inverter 605 is active even after the clock input CLK 604 has transitioned from logic '0' to logic '1'. Thus, there is a feedback and retention path for node 'A' and the latch 620 remains at a correct logic even when the latch input D 602 transitions to logic '0' from logic '1' after the clock input CLK 604 has transitioned to logic '1', i.e., a retention of logic in the latch 620 is not dependent on the output of the tri-state inverter 605 when the clock input CLK 604 is at logic '1'.

The logic '0' at node 'B' activates the third PMOS transistor 614. Since the node 'A' is at logic '1', the output of first inverter 608, N1 612 is at logic '0' which deactivates the fourth NMOS transistor 618. The clock input CLK 604 is at logic '1' which activates the third NMOS transistor 616 and therefore the output of the half tri-state inverter 610 is at logic '1' which is same as the logic at node 'A'. Thus, the node 'A' continues to be at logic '1' i.e. same logic state is in the third state. Thus, no ambiguity of logic occurs in the latch 620. Thus, the latch 620 holds a same value (i.e. logic '0') of the latch input D 602 as in the third state.

The second logic gate 650 receives the logic '0' from node 'B' and generates the gated clock GCLK 652 which is at logic '1'. Table 3 summarizes the states of the latch 620

TABLE 3

| | Latch Input 'D' | Node 'A' | Node 'B' | GCLK |
|---|---|---|---|---|
| Clk = 0, E = 0 | 1 | 0 | 1 | 0 |
| Clk = 1, E = 0 | 1 | 0 | 1 | 0 |
| Clk = 0, E = 1 | 0 | 1 | 1 | 0 |
| Clk = 1, E = 1 | 0 | 1 | 0 | 1 |

In an example, the first logic gate 603 is an inverting logic gate and receives the enable signal E 601 and the test enable signal TE. When the test enable signal TE is at logic '1' and the enable signal E 601 is at one of either logic '0' or logic '1', the ICG cell 600 is activated and the gated clock GCLK 652 is equal to the clock input CLK 604. It is assumed that when the enable signal E 601 or the test enable signal TE is at logic '1', the ICG cell 600 is activated.

When the test enable signal TE is at logic '0' and the enable signal E 601 is at logic '0', the ICG cell 600 is deactivated and the gated clock GCLK 652 is at logic '0'. When the test enable signal TE is at logic '0' and the enable signal E 601 is at logic '1', the ICG cell 600 is activated and the gated clock GCLK 652 is equal to the clock input CLK 604.

The inverting logic gate 606 (NAND gate) eliminates a need of an inverter in the ICG cell 600 to generate an inverted clock input CLKZ. However, a conventional ICG cell which uses latch 100 requires an inverter to generate the inverted clock input CLKZ. The ICG cell 600 is an area efficient design as a number of transistors required for ICG cell 600 is less than the conventional ICG cell. In one example, the ICG cell 600 is implemented using 16 transistors while the conventional ICG cell requires 18 transistors. This translates to an area savings of around 11%.

Also, with reduced number of transistors the power consumption of the ICG cell 600 is less than the power consumption in conventional ICG cell. In an example, a number of transistors that undergo switching based on clock input CLK have been reduced from 8 transistors in conventional ICG cell to 4 transistors in ICG cell 600. The power consumption is reduced by around 50% in ICG cell 600 as compared to conventional ICG cell.

FIG. 7 illustrates a schematic of a digital logic block 700, according to an embodiment. The digital logic block 700 includes a plurality of integrated clock gating (ICG) cells 705, a plurality of flip flops (725, 730, 735, 740 and 745) coupled to each of the plurality of the integrated clock gating cells 705. The ICG cells 705 are analogous to the ICG cell 600 explained in FIG. 6 both in connections and operation. The digital logic block 700 also includes a combinational logic 750 connected to the flip flops (725-745) and is used in conjunction with synchronous modules or a plurality of synchronous modules in an IC. These synchronous modules typically include multiplexers, communication ports, processors, storage elements etc. The digital logic block 700 receives a clock input 760 and generates an output 755.

The digital logic block 700 is, or is incorporated into, a mobile communication device, such as a mobile phone, a personal digital assistant, a personal computer, or any other type of electronic system. The ICG cells 705 reduce power consumption by preventing individual flip flops (725-745) from switching between logic states when not in use. Thus, the clock power consumption due to clock switching is reduced. The ICG cells 705 selectively inactivate the flip flops which are not contributing to the functionality of the digital logic block 700. The ICG cells 705 are activated or deactivated based on certain conditions.

The ICG cell 705 is an area efficient design as a number of transistors required for ICG cell 705 is less than the conventional ICG cell. In one example, the ICG cell 705 is implemented using 16 transistors while the conventional ICG cell requires 18 transistors. This translates to an area savings of around 11%.

Also, with reduced number of transistors the power consumption of the ICG cell 705 is less than the power consumption in conventional ICG cell. In an example, a number of transistors that undergo switching based on clock input CLK have been reduced from 8 transistors in conventional ICG cell to 4 transistors in ICG cell 705. The power consumption is reduced by around 50% in ICG cell 705 as compared to conventional ICG cell.

In the foregoing discussion, the terms "connected" means at least either a direct electrical connection between the devices connected or an indirect connection through one or more passive intermediary devices. The term "circuit" means at least either a single component or a multiplicity of passive components, that are connected together to provide a desired function. The term "signal" means at least one current, voltage, charge, data, or other signal. Also, the terms "coupled to" or "couples with" (and the like) are intended to describe either an indirect or direct electrical connection. Thus, if a first device is coupled to a second device, that connection can be through a direct electrical connection, or through an indirect electrical connection via other devices and connections. Further, the term "high" is generally intended to describe a signal that is at logic "1," and the term "low" is generally intended to describe a signal that is at logic "0." The term "on" applied to a transistor or group of transistors is generally intended to describe gate biasing to enable current flow through the transistor or transistors. Also, the terms "inactivation" or "inactivated" or turn "OFF" or turned "OFF" is used to describe a deactivation of a device, a component or a signal. The terms "activation" or "activated" or turned "ON" describes activation of a device, a component or a signal.

The foregoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. A latch comprising:
   a tri-state inverter configured to receive a latch input and a clock input;
   an inverting logic gate configured to receive the clock input and an output of the tri-state inverter and configured to generate a control signal, the control signal is configured to activate the tri-state inverter;
   a first inverter configured to receive the output of the tri-state inverter and configured to generate a first inverted output;
   a half tri-state inverter configured to receive the control signal, the clock input and the first inverted output; and
   an output inverter configured to receive the output of the tri-state inverter and configured to generate a latch output.

2. The latch of claim 1 is at least one of a high level triggered latch and a low level triggered latch.

3. The latch of claim 2, wherein when the clock input is at logic '0' in the low level triggered latch, the control signal activates the tri-state inverter such that the output of the tri-state inverter is inverse of the latch input.

4. The latch of claim 2, wherein when the clock input is at logic '1' in the high level triggered latch, the control signal activates the tri-state inverter such that the output of the tri-state inverter is inverse of the latch input.

5. The latch of claim 1, wherein the tri-state inverter comprises:
   a first PMOS transistor and a first NMOS transistor, a gate terminal of the first PMOS transistor and a gate terminal of the first NMOS transistor configured to receive the latch input;
   a second PMOS transistor coupled to a drain terminal of the first PMOS transistor; and
   a second NMOS transistor coupled to a drain terminal of the first NMOS transistor, wherein a drain terminal of the second PMOS transistor is coupled to a drain terminal of the second NMOS transistor to generate the output of the tri-state inverter.

6. The latch of claim 5, wherein when the latch is a low level triggered latch, a gate terminal of the second PMOS transistor is configured to receive the clock input and a gate terminal of the second NMOS transistor is configured to receive the control signal.

7. The latch of claim 5, wherein when the latch is a high level triggered latch, the gate terminal of the second PMOS transistor is configured to receive the control signal and the gate terminal of the second NMOS transistor is configured to receive the clock input.

8. The latch of claim 1, wherein the inverting logic gate is a NAND gate when the latch is a low level triggered latch, and the inverting logic gate is a NOR gate when the latch is a high level triggered latch.

9. The latch of claim 1, wherein when the latch is a low level triggered latch, the half tri-state inverter comprises:
   a third PMOS transistor, a gate terminal of the third PMOS transistor configured to receive the control signal;
   a third NMOS transistor coupled to a drain terminal of the third PMOS transistor, a gate terminal of the third NMOS transistor configured to receive the clock input; and
   a fourth NMOS transistor coupled to a source terminal of the third NMOS transistor, a gate terminal of the fourth NMOS transistor configured to receive the first inverted output.

10. The latch of claim 1, wherein when the latch is a high level triggered latch, the half tri-state inverter comprises:
    a third NMOS transistor, a gate terminal of the third NMOS transistor configured to receive the control signal;
    a fourth PMOS transistor coupled to a drain terminal of the third NMOS transistor, a gate terminal of the fourth PMOS transistor configured to receive the clock input; and
    a third PMOS transistor coupled to a source terminal of the fourth PMOS transistor, a gate terminal of the third PMOS transistor configured to receive the first inverted output.

11. The latch of claim 1, wherein the output inverter is configured to invert the output of the tri-state inverter to generate the latch output.

12. The latch of claim 1, wherein the latch is configured to receive at least one of a clear signal and a preset signal.

13. An ICG (integrated clock gating) cell comprising:
    a first logic gate configured to receive an enable signal and configured to generate a latch input;
    a latch coupled to the first logic gate and configured to receive the latch input and a clock input, the latch comprising a tri-state inverter and an inverting logic gate, the tri-state inverter is configured to be activated by a control signal generated by the inverting logic gate; and
    a second logic gate configured to receive the control signal and configured to generate a gated clock.

14. The ICG cell of claim 13, wherein the tri-state inverter is coupled to the first logic gate and configured to receive the latch input and the clock input.

15. The ICG cell of claim 13, wherein the inverting logic gate is configured to generate the control signal in response to the clock input and an output of the tri-state inverter.

16. The ICG cell of claim 13, wherein the latch further comprises:
    a first inverter configured to receive the output of the tri-state inverter and configured to generate a first inverted output; and
    a half tri-state inverter configured to receive the control signal, the clock input and the first inverted output.

17. An ICG (integrated clock gating) cell comprising:
    a first logic gate configured to receive an enable signal and configured to generate a latch input;
    a tri-state inverter coupled to the first logic gate and configured to receive the latch input and a clock input;
    an inverting logic gate configured to receive the clock input and an output of the tri-state inverter and configured to generate a control signal, the control signal is configured to activate the tri-state inverter;

a first inverter configured to receive the output of the tri-state inverter and configured to generate a first inverted output;

a half tri-state inverter configured to receive the control signal, the clock input and the first inverted output; and a second logic gate configured to receive the control signal and configured to generate a gated clock.

18. An apparatus comprising:

a clock input;

a plurality of ICG (integrated clock gating) cells configured to receive the clock input, wherein each of the ICG (integrated clock gating) cell comprises:

a first logic gate configured to receive an enable signal and configured to generate a latch input;

a latch configured coupled to the first logic gate and configured to receive the latch input and the clock input, the latch comprising a tri-state inverter and an inverting logic gate, the tri-state inverter is configured to be activated by a control signal generated by the inverting logic gate; and a second logic gate configured to receive the control signal and configured to generate a gated clock.

* * * * *